United States Patent [19]

Fujimura et al.

[11] 4,433,994
[45] Feb. 28, 1984

[54] METHOD OF MANUFACTURING CURVED DISCHARGE TUBES

[75] Inventors: Takashi Fujimura; Katsuyu Takahashi, both of Mobara, Japan

[73] Assignee: Hitachi, Ltd., Tokyo, Japan

[21] Appl. No.: 274,512

[22] Filed: Jun. 17, 1981

[30] Foreign Application Priority Data

Jun. 29, 1980 [JP] Japan ............................ 55-118306

[51] Int. Cl.$^3$ ............................................. C03B 23/06
[52] U.S. Cl. ........................................ 65/110; 65/108; 65/281; 65/292
[58] Field of Search ................ 65/108, 110, 281, 292, 65/276

[56] References Cited

U.S. PATENT DOCUMENTS

| | | | |
|---|---|---|---|
| 1,846,349 | 2/1932 | Morrison | 65/292 |
| 1,874,012 | 8/1932 | Hotchner | 65/108 X |
| 2,571,416 | 10/1951 | Brown | 65/281 |
| 4,288,239 | 9/1981 | Hoeh | 65/108 X |

FOREIGN PATENT DOCUMENTS 38-3431 of 1963 Japan.

Primary Examiner—Arthur D. Kellogg
Attorney, Agent, or Firm—Charles E. Pfund

[57] ABSTRACT

A curved discharge tube is manufactured by preparing a straight quartz tube having an eccentric longitudinal opening and then bending the heated tube into a current tube with a thicker waall portion of the tube on the outside and the thinner wall portion on the inner side. It is advantageous to seal inner gas into the tube before bending so as to obtain a curved tube having uniform wall thickness.

5 Claims, 18 Drawing Figures

FIG.2
(a) PRIOR ART
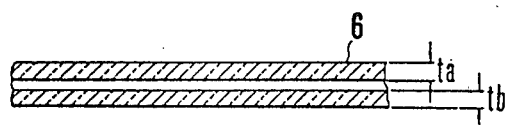
(c) PRIOR ART        (b) PRIOR ART
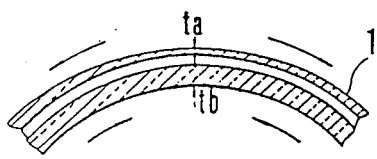   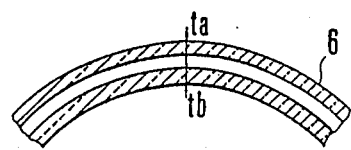
FIG.3
(a)                  (b)
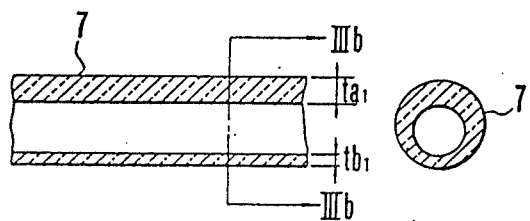   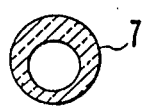
FIG.4
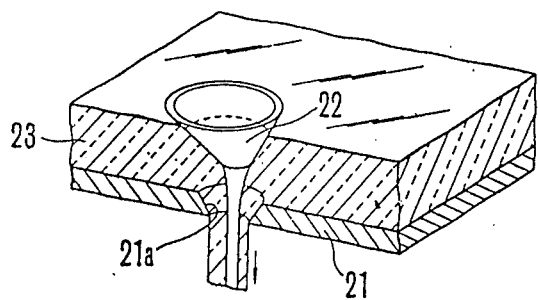

METHOD OF MANUFACTURING CURVED DISCHARGE TUBES

BACKGROUND OF THE INVENTION

This invention relates to a method of manufacturing a curved discharge tube, and more particularly a curved discharge tube, for example a ultra high pressure mercury lamp utilized to form a pattern with photolithography technique by irradiating a photosensitive substance with ultraviolet rays.

When forming such a fine pattern as an integrated circuit pattern on the surface of a semiconductor wafer by photolithography, a curved discharge tube, for example a curved ulta high pressure mercury lamp is used for the purpose of minimizing the effect caused by the interference or diffraction of light.

As shown in FIG. 1A such curved discharge tube comprises a curved transparent tube 1 made of glass or quartz, for example, inert gas 2 such as mercury and argon and tungsten electrodes 3 sealed in the glass tube at the opposite ends. When the electrodes 3 are connected across a source of a predetermined voltage the central portion of the tube luminesces. Such a curved discharge tube is utilized as a light source having little diffraction and interference of light and can form an image of small aberration. The light emitted by the tube is projected upon a semiconductor wafer through an optical system including concave and convex lenses, a reflecting mirror etc. and then projected upon a photoconductor wafer through another optical system. Where the light emitted by the discharge tube is focused and then passed through a fine slit made of a vapor deposited chromium film to form a beam having small scattering, only a portion of the light emitted by the tube, that is the light between dot and dash lines shown in FIG. 1 passes through the slit so that the dimension of that portion of the tube should be accurate. The birds eye view of the brightness distribution shown in FIG. 1 is obtained by observing the light emitted by a portion as of the curved discharge tube shown in FIG. 1 through a pin hole. The crest of the brightness lies at the central portion of the discharge arc. Especially in a double tube type ultra high pressure mercury arc lamp the vest lies at substantially the center of the inner tube. Accordingly, in order to improve the quality of the light source, the diameter D of the outer tube D, the diameter d of the inner tube and the radius of curvature of the axis of the tube should be accurate.

Usually the curved mercury lamp is prepared in the following manner. At first a straight tube 6 having a uniform wall thickness as shown in FIG. 2a is heated and then pressed against a curved jig to form a curved tube as shown in FIG. 2b. At this time, the outer side of the tube is elongated, whereas the inner side is compressed with the result that the wall thickness on the outer side is decreased whereas that on the inner side is increased. For this reason the inner opening of the tube becomes eccentric. Since the glass tube is heated to 1600°-200° C. there is a large temperature difference between the tube and the jig, whereby a large strain remains in the curved tube. Furthermore, due to the pressure applied by the jig. the inner opening of the tube would be deformed. Thus, in order to make uniform the distribution of the light emitted by the discharge arc it is necessary to make uniform the inner and outer diameters of the curved tube.

SUMMARY OF THE INVENTION

Accordingly, it is an object of this invention to provide an improved method of manufacturing a curved dicharge tube having a uniform brightness distribution along the tube axis.

Another object of this invention is to provide a method of manufacturing a curved discharge tube having a light emitting portion of a uniform wall thickness.

Still another object of this invention is to provide a method of manufacturing a curved discharge tube having a long operating life.

According to this invention there is provided a method of manufacturing a curved discharge tube comprising the steps of preparing a straight tube made of transparent material and having an eccentric longitudinal opening, heating the straight tube, and bending the tube into a curved tube with a thicker wall portion on the outside and a thinner wall portion on the inside. The heated straight tube is bent about a saddle shaped heated jig. After bending the curved tube is clamped between opposing jigs each having a groove conforming to the outer contour of the curved tube to correct radial and longitudinal deformations of the tube.

BRIEF DESCRIPTION OF THE DRAWINGS

In the accompanying drawings:

FIG. 1A is a diagrammatic representation of the prior art curved discharge tube;

FIGS. 2a, 2b and 2c are longitudinal sectional views showing the steps of manufacturing a prior art curved discharge tube shown in FIG. 1A;

FIG. 3a is a longitudinal sectional view showing a straight glass tube utilized in this invention;

FIG. 3b is a cross-sectional view of the glass tube shown in FIG. 3a taken along a line IIIb.

FIG. 4 is a diagrammatic representation showing one example of manufacturing a glass tube having an eccentric opening utilized in this invention;

DESCRIPTION OF THE PREFERRED EMBODIMENTS

Figure 1:
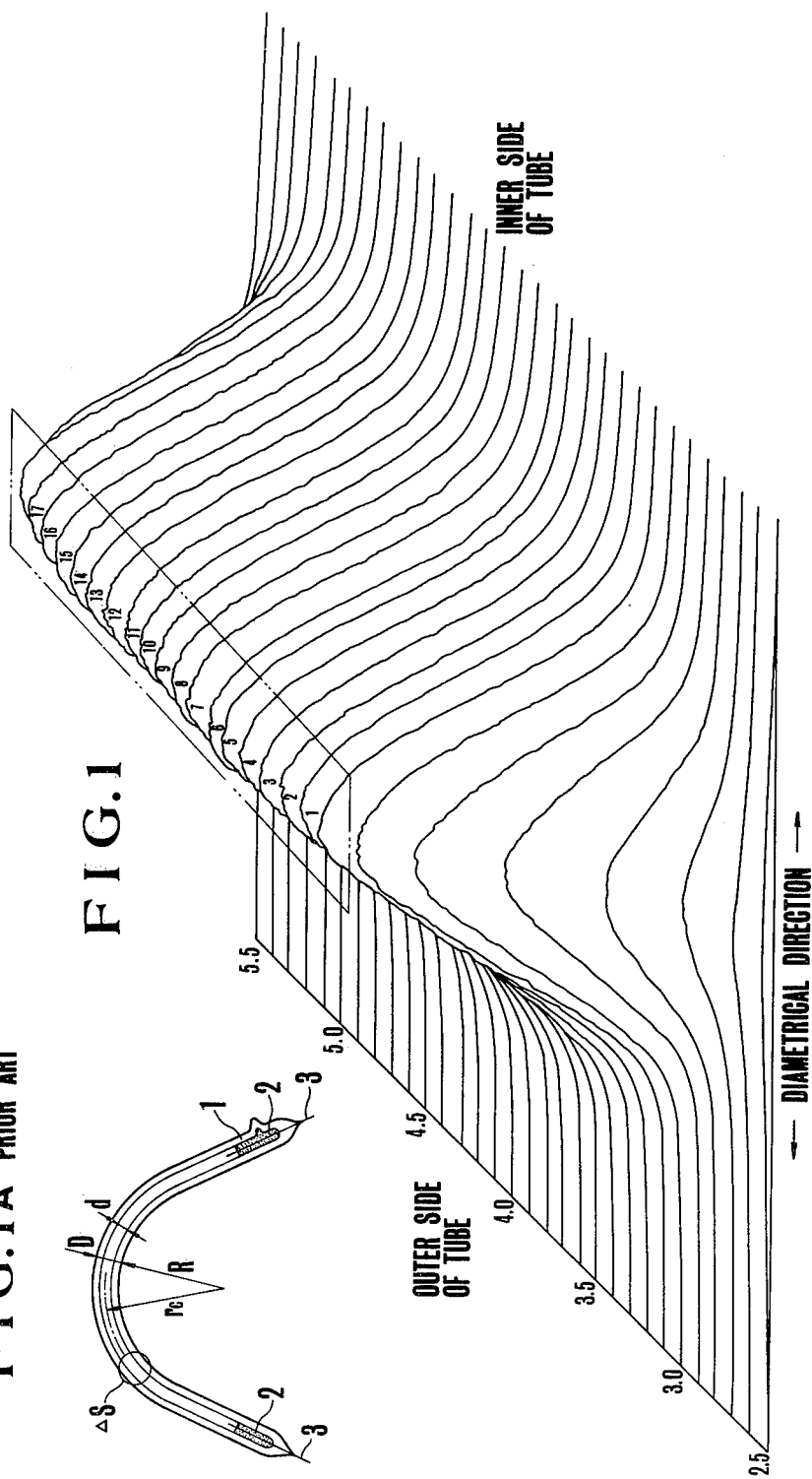
FIG. 1 shows the brightness distribution of a portion as of the tube shown in FIG. 1A.

The curved discharge tube is manufactured in the following manner. At first a glass or quartz tube 7 having an eccentric axial opening is prepared. According to this invention, the outer wall thickness $a_1$ is made to be larger than the inner wall thickness $b_1$. Such tube is prepared by disposing an asymmetric frustum shaped floating die 22 near an opening $21_a$ of a die 21 as shown in FIG. 4 and then extruding molten glass 23 through the die opening 21. This method is disclosed, for example in Japanese Publication of Patent Specification No. 3431 of 1963. In a modified method, the floating die 22 is made symmetrical to form a straight tube having a uniform wall thickness and the tube is then etched to obtain a straight tube having an eccentric longitudinal opening as shown in FIGS. 3a and 3b.

The straight tube 7 thus prepared is then heated to 1100° C. to 1800° C. and pressed against the periphery of a round rod shaped jig 8 with the thinner side of the tube 7 contacted with the jug 8 to obtain a curved pipe 9. At this time, when there is a large temperature difference between the tube and the jig 8 a strain would be created in the curved tube so that it is advantageous to heat the jig to about 1100° C.–1800° C. with gas flames 10. Since the jig may be oxidized by the flames it is advantageous to make the jig 8 of such refractory material as tungusten, stainless steel, carbon, boron etc. In order to assure precise inner diameter of the curved tube it is desirable to have the following relation $$R + D/2 = r_c$$

where D represents the outer diameter of the tube 9, $D_G$ the diameter of the jig 8, R the distance between the axis of the jig and the center of the jig and $r_c$ the distance between the axis of the jig and the axis of the tube. An additional condition, $D_G$ 2R where R represents the radius of the inner wall of curved pipe 9, ensures stability of dimensions after cooling and facilitates the working such that the diameter D can be determined beforehand by polishing.

Figure 5:
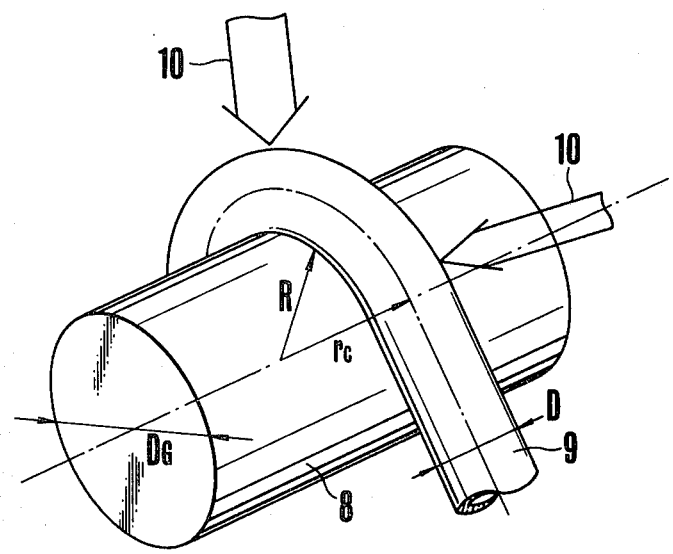
FIG. 5, FIGS. 6a, 6b and 6c show one example of bending the straight glass tube having an eccentric opening shown in FIG. 3.
Figure 6A:
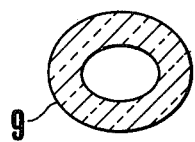
Figure 6C:
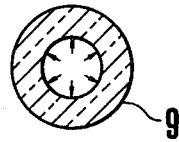
Figure 6B:
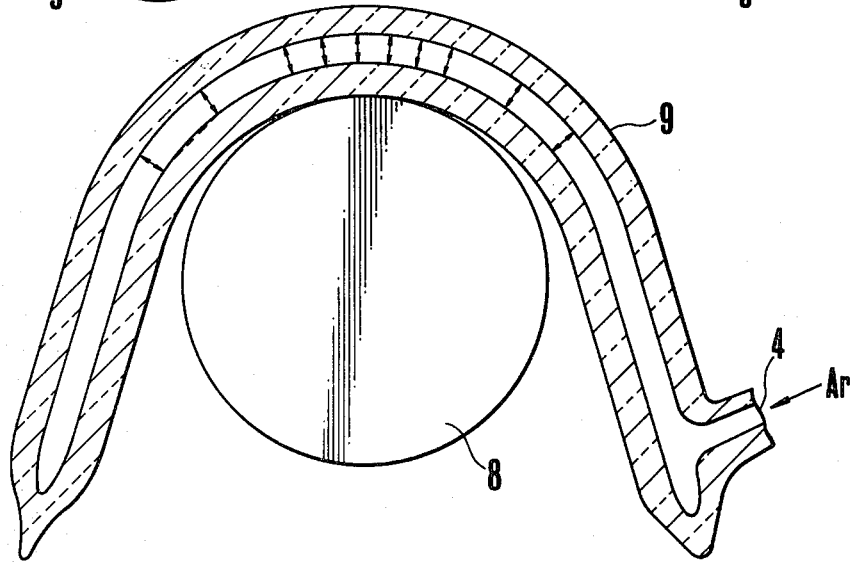

When bending the tube as shown in FIG. 5, there is a tendency of deforming the tube to have an elliptic sectional configuration as shown in FIG. 6a. To introduce this inert gas such as argon is into the tube 9. The tube is then sealed by fusing the inlet pipe 4. (FIG. 6b). Then uniform inner pressure is applied to all inner surface of the tube as shown in FIG. 6c to obtain a curved tube having a true circular cross-section and uniform wall thickness.

Figure 7A:
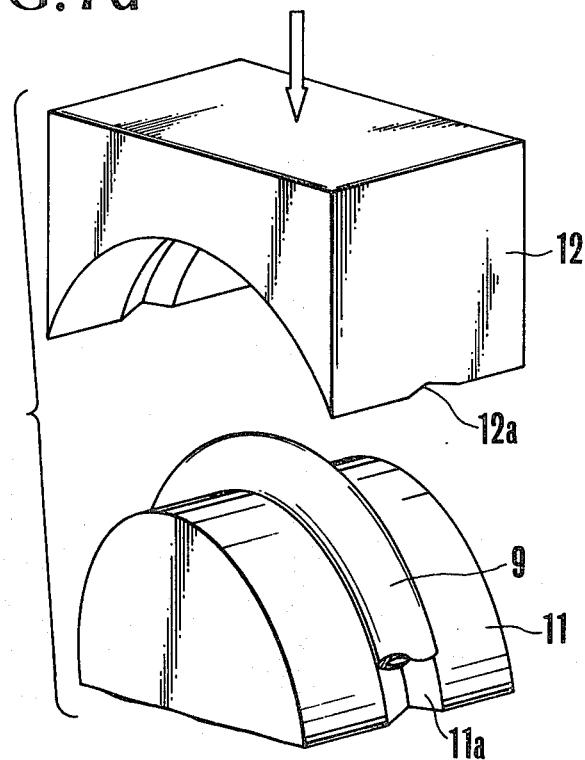
FIGS. 7a and 7b, FIG. 8 and FIGS. 9a and 9b show methods of removing strain from the curved tube formed by bending the tube according to the method shown in FIGS. 5 and 6.
Figure 7B:
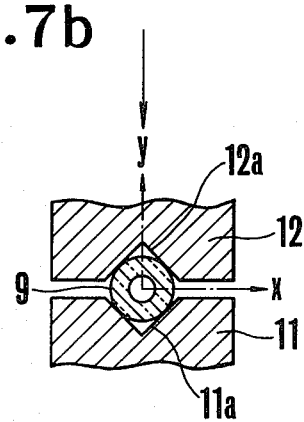
Figure 8:
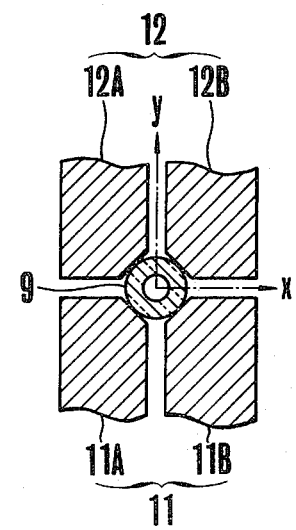
Figure 9A:
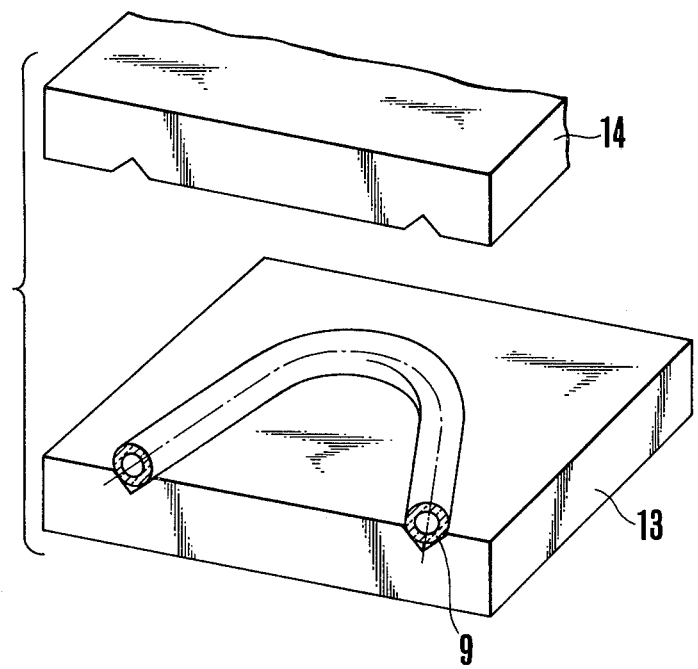
Figure 9B:
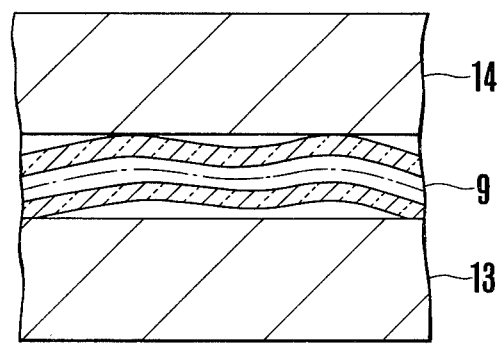

FIGS. 7a and 7b show another method of forming a curved tube. In this case saddle shaped jigs 11 and 12 made of carbon, for example and having inside and outside contours similar to those of the curved tube 9 are used. A curved tube shaped by the method shown in FIGS. 5 or 6 is heated to 1000°–1800° C. and then mounted on the lower jig 11. Then the upper jig 12 is mounted on the curved tube 9 and pressure is applied to the jig 12. Jigs 11 and 12 are provided with triangular grooves 11a and 12a to receive the tube 9 in these grooves. Pressure is applied to the peripery of the tube along four contact lines to correct the deformation of the tube in the x and y directions. Alternatively, as shown in FIG. 8, the lower and upper jigs may be divided respectively into two halves 11A, 11B and 12A, 12B.

A curved tube 9 removed with deformations in the x and y directions is reheated to a high temperature of 1600° C.–1800° C. and then clamped between flat plate shaped jigs 13 and 13 made of carbon, for example, and provided with grooves of a shape similar to the completed curved discharge tube. Then the jigs are pressed toward each other to correct axial distortion (in the direction of z). This treatment removes OH⁻ remaining in the tube.

According to this invention, it is possible to decrease the axial distortion to only ±100 microns in a tube having an outer diameter of 5.6 mm, an inner diameter of 2.0 mm, and an arc length of 45 mm. In a 1.8 KW discharge tube utilizing the curved tube 9, the variation in the brightness in the direction perpendicular to arc was only ±5%.

The method of manufacturing a curved discharge tube described above has the following advantages.

As it is possible to obtain a curved discharge tube having a luminous portion of uniform wall thickness from a pipe having nonuniform wall thickness and an eccentric inner opening it is possible to expand the effective region in the radial and axial direction of the luminous portion that can be used as a light source. The discharge tube including a luminous portion of a uniform wall thickness has a uniform cooling effect so that breakage of the tube caused by collision of a large number of electrons due to nonuniform temperature distribution of the tube wall as in the prior art curved tube discharge tube can be precluded.

Moreover, as it is possible to manufacture a curved tube having accurate outer and inner diameters and corrected destortions in the radial and longitudinal direction of the tube it is possible to obtain a uniform brightness distribution.

What is claimed is:

1. A method of manufacturing a curved discharge tube comprising the steps of preparing a straight tube made of transparent material and having an eccentric longitudinal opening, heating the straight tube and bending said tube into a curved tube with a thicker wall portion of the tube on the outside and a thinner wall portion on the inside.

2. The method according to claim 1 wherein said heated straight tube is bent about a heated jig in the form of a round rod having diameter of less than twice of a radius of said tube.

3. The method according to claim 1 which further comprises the step of sealing inner gas in said straight tube before bending the same.

4. The method according to claim 1 which further comprises the steps of clamping said curved tube between opposing dies each provided with a groove conforming a outer contour of said curved tube and applying pressure to said curved tube through said dies.

5. The method according to claim 4 wherein said dies take the form of flat plates.

* * * * *

UNITED STATES PATENT AND TRADEMARK OFFICE
CERTIFICATE OF CORRECTION

PATENT NO. : 4,433,994
DATED : Feb. 28, 1984
INVENTOR(S) : Takashi Fujimura and Katsuyu Takahashi It is certified that error appears in the above-identified patent and that said Letters Patent is hereby corrected as shown below:

In the Abstract, line 4, correct "waall" to --wall--.

Col. 1, line 61, change "1600 -200 C" to --1600 -2000 C--.

Col. 1, line 64, delete the period "(.)" after "jig".

Col. 3, line 9, change "tungusten" to --tungsten--.

Col. 3, line 15, change "D" to --$\underline{D}$--.

Col. 3, line 16, change "$D_G$" to --$D_{\underline{G}}$--.

Col. 3, line 19, change "$D_G 2R$ where R" to --$D_{\underline{G}} 2R$ where $\underline{R}$--.

Col. 3, line 43, change "peripery" to --periphery--.

Col. 4, line 28, change "destortions" to --distortions--.

Signed and Sealed this

Nineteenth Day of February 1985

[SEAL]

Attest:

DONALD J. QUIGG

Attesting Officer    Acting Commissioner of Patents and Trademarks